(12) United States Patent
Sinha et al.

(10) Patent No.: US 7,269,067 B2
(45) Date of Patent: Sep. 11, 2007

(54) PROGRAMMING A MEMORY DEVICE

(75) Inventors: Shankar Sinha, Redwood Shores, CA (US); Zhizheng Liu, San Jose, CA (US); Yi He, Fremont, CA (US)

(73) Assignee: Spansion LLC, Sunnyvale, CA (US)

( * ) Notice: Subject to any disclaimer, the term of this patent is extended or adjusted under 35 U.S.C. 154(b) by 42 days.

(21) Appl. No.: 11/174,560

(22) Filed: Jul. 6, 2005

(65) Prior Publication Data

US 2007/0008782 A1    Jan. 11, 2007

(51) Int. Cl.
*G11C 11/34* (2006.01)
(52) U.S. Cl. ................ 365/185.18; 365/185.24; 365/185.19; 365/185.28
(58) Field of Classification Search ........... 365/185.18, 365/185.24, 185.19, 185.28
See application file for complete search history.

(56) References Cited

U.S. PATENT DOCUMENTS

| | | | | |
|---|---|---|---|---|
| 4,870,470 A * | 9/1989 | Bass et al. | ................ | 257/324 |
| 5,585,293 A * | 12/1996 | Sharma et al. | ........... | 438/261 |
| 5,592,002 A * | 1/1997 | Kanamori | ................ | 257/321 |
| 6,040,996 A * | 3/2000 | Kong | ................ | 365/185.19 |
| 6,188,102 B1 * | 2/2001 | Tsukiji | ............... | 257/315 |
| 6,330,190 B1 * | 12/2001 | Wang et al. | ........... | 365/185.28 |
| 6,346,467 B1 * | 2/2002 | Chang et al. | ............. | 438/594 |
| 6,347,054 B1 * | 2/2002 | Wang et al. | ........... | 365/185.29 |
| 6,363,012 B1 * | 3/2002 | Lin et al. | ............... | 365/185.18 |
| 6,469,343 B1 * | 10/2002 | Miura et al. | ............. | 257/324 |
| 6,570,788 B1 * | 5/2003 | Nakamura | ............. | 365/185.18 |
| 6,628,544 B2 * | 9/2003 | Shum et al. | ........... | 365/185.03 |
| 6,649,453 B1 * | 11/2003 | Chen et al. | ............. | 438/130 |
| 6,687,154 B2 * | 2/2004 | Lee et al. | ............. | 365/185.03 |
| 6,767,790 B2 * | 7/2004 | Kobayashi | ................ | 438/257 |
| 6,795,342 B1 * | 9/2004 | He et al. | ............. | 365/185.16 |
| 6,828,623 B1 * | 12/2004 | Guo et al. | ................ | 257/321 |
| 6,847,556 B2 * | 1/2005 | Cho | ................ | 365/185.28 |
| 6,894,924 B2 * | 5/2005 | Choi et al. | ............. | 365/185.01 |
| 6,906,953 B2 * | 6/2005 | Forbes | ................ | 365/185.03 |
| 6,977,412 B2 * | 12/2005 | Smith | ................ | 257/324 |
| 7,120,063 B1 * | 10/2006 | Liu et al. | ............. | 365/185.24 |
| 7,138,681 B2 * | 11/2006 | Forbes et al. | ............. | 257/316 |
| 2005/0105341 A1 | 5/2005 | Forbes | | |

FOREIGN PATENT DOCUMENTS

WO    2004/051667    6/2004

OTHER PUBLICATIONS

Bloom et al., "NROM<TM>—a new technology for non-volatile memory products", Solid State Electronics, Elsevier Science Publishers, Barking, GB, vol. 46, No. 11, Nov. 2002, pp. 1757-1763.
PCT Search Report and Written Opinion, Jan. 19, 2007, 12 pages.

* cited by examiner

*Primary Examiner*—Viet Q. Nguyen
(74) *Attorney, Agent, or Firm*—Harrity Snyder LLP (57) ABSTRACT

A method of programming a memory cell in a non-volatile memory device includes applying a first voltage to a control gate associated with the memory cell and applying a second voltage to a drain region associated with the memory cell. The method also includes applying a positive bias to a source region associated with the memory cell and/or applying a negative bias to a substrate region associated with the memory cell.

19 Claims, 14 Drawing Sheets

PROGRAMMING A MEMORY DEVICE

TECHNICAL FIELD

The present invention relates generally to memory devices. The invention has particular applicability to methods for programming memory devices.

BACKGROUND ART

The escalating demands for high density and performance associated with non-volatile memory devices require small design features, high reliability and increased manufacturing throughput. The reduction of design features, however, challenges the limitations of conventional methodology. For example, the reduction of design features makes it difficult for the memory device to meet its expected data retention requirement.

In addition, once a memory device, such as an electrically erasable programmable read only memory (EEPROM) device, has been fabricated, the memory device must be able to be programmed and erased in an efficient manner. In flash EEPROM devices, an entire sector of memory cells may be programmed or erased together. As the product density (e.g., the density of the core memory cell array) increases, it is difficult to increase programming speeds without increasing the programming voltages/power applied to the memory cells. It is also difficult to maintain fast programming speeds at lower power levels. Increasing programming voltages/power, however, often creates problems associated with the memory devices. For example, increasing programming voltages may lead to breakdowns in various layers, such as dielectric layers, used in the memory device. These problems may make it difficult to program and/or erase the memory device in an efficient manner and, ultimately, may lead to device failure.

DISCLOSURE OF THE INVENTION

Implementations consistent with the invention provide methods for programming memory devices with improved programming speeds and/or reduced power.

Additional advantages and other features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

According to one aspect consistent with the invention, a method of programming at least one memory cell in a non-volatile memory device is provided. The non-volatile memory device includes a number of memory cells, where each of the memory cells includes a source, a drain, a dielectric layer formed on a substrate, a charge storage element including silicon nitride formed on the dielectric layer, an inter-gate dielectric formed on the charge storage element and a control gate formed on the inter-gate dielectric. The method includes applying a first voltage to the control gate and applying a second voltage to the drain. The method also includes applying at least one of a positive bias to the source or a negative bias to the substrate.

According to another aspect consistent with the invention, a method for programming memory cells in a non-volatile memory device is provided, where each of the memory cells includes a dielectric charge storage element. The method includes selecting a first group of memory cells to be programmed. The method also includes applying a first voltage to a word line associated with the first group of memory cells and applying a second voltage to a drain line associated with the first group of memory cells. The method further includes applying at least one of a positive voltage to a source line associated with the first group of memory cells or a negative voltage to a substrate region associated with the first group of memory cells.

According to a further aspect consistent with the invention, an integrated circuit is provided. The integrated circuit includes a number of memory cells, where each of the memory cells includes a dielectric charge storage element. The integrated circuit also includes a controller configured to program a first one of the memory cells. When programming the first memory cell, the controller is configured to apply a first voltage to a control gate associated with the first memory cell and apply a second voltage to a drain region associated with the first memory cell. The controller is also configured to apply a third voltage to a source region associated with the first memory cell and apply a fourth voltage to a substrate region associated with the first memory cell.

Other advantages and features of the invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

BEST MODE FOR CARRYING OUT THE INVENTION

Figure 1:
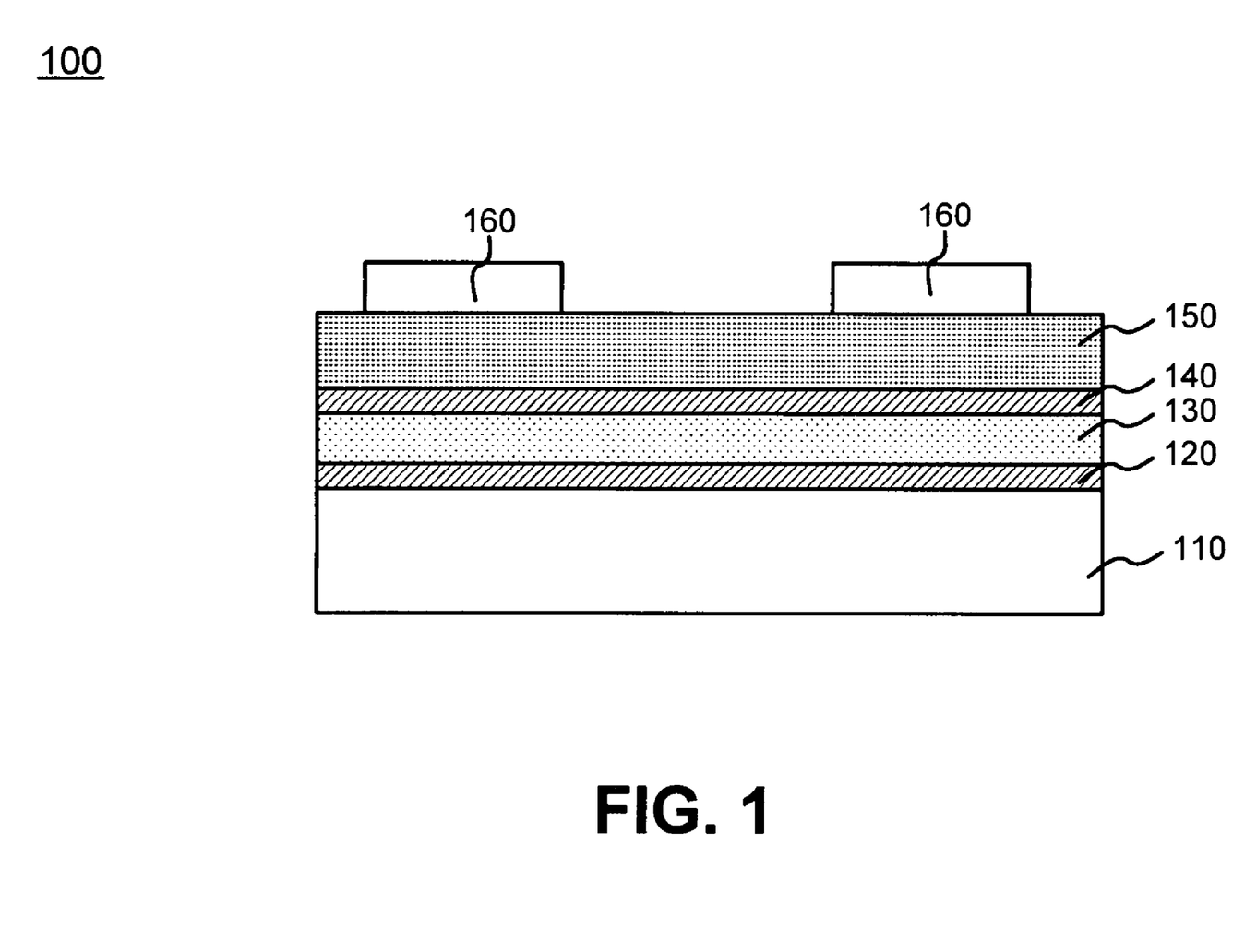
FIG. 1 is a cross-section illustrating exemplary layers used to form memory cells in accordance with an embodiment of the invention.

FIG. 1 illustrates the cross-section of a semiconductor device 100 formed in accordance with an embodiment of the invention. Referring to FIG. 1, semiconductor device 100 may include layers 110, 120, 130, 140 and 150. In an exemplary embodiment, layer 110 may be a substrate of semiconductor device 100 and may include silicon, germanium, silicon-germanium or other semiconducting materials. In alternative implementations, layer 110 may be a conductive layer or a dielectric layer formed a number of layers above the surface of a substrate in semiconductor device 100.

Layer 120 may be a dielectric layer formed on layer 110 in a conventional manner. In an exemplary implementation, dielectric layer 120 may include an oxide, such as a silicon oxide (e.g., $SiO_2$), and may have a thickness ranging from about 30 Å to about 80 Å. Dielectric layer 120 may function as a tunnel oxide layer for a subsequently formed memory cell of semiconductor device 100.

Layer 130 may be formed on layer 120 in a conventional manner and may include a dielectric material, such as a nitride (e.g., a silicon nitride) or an oxynitride. Layer 130, consistent with the invention, may act as a charge storage layer for semiconductor device 100 and may have a thickness ranging from about 50 Å to about 100 Å. In alternative implementations, layer 130 may include a conductive material, such as polycrystalline silicon, used to form a floating gate electrode.

Layer 140 may be formed on layer 130 in a conventional manner and may include a dielectric material, such as an oxide (e.g., $SiO_2$). Alternatively, layer 140 may include a material having a high dielectric constant (K), such as a K value ranging from 12-22 or higher, that may be deposited or thermally grown on layer 130. In still other alternatives, layer 140 may be a composite that includes a number of dielectric layers or films. Layer 140 may have a thickness ranging from about 60 Å to about 150 Å and may function as an inter-gate dielectric for memory cells in semiconductor device 100.

Layer 150 may include a conductive material, such as polycrystalline silicon, formed on layer 140 in a conventional manner. Alternatively, layer 150 may include other semiconducting materials, such as germanium or silicon-germanium, or various metals, such as titanium or tungsten. Layer 150, consistent with the invention, may be used to form one or more control gate electrodes for one or more memory cells in semiconductor device 100. In an exemplary implementation, layer 150 may have a thickness ranging from about 1,000 Å to about 2,000 Å. An optional silicide layer, such as titanium silicide (not shown) may be formed on layer 150.

A photoresist material may be patterned and etched to form masks 160 on the top surface of layer 150, as illustrated in FIG. 1. Masks 160 may be used to facilitate formation of memory cells in semiconductor device 100, as described in more detail below.

Figure 2:
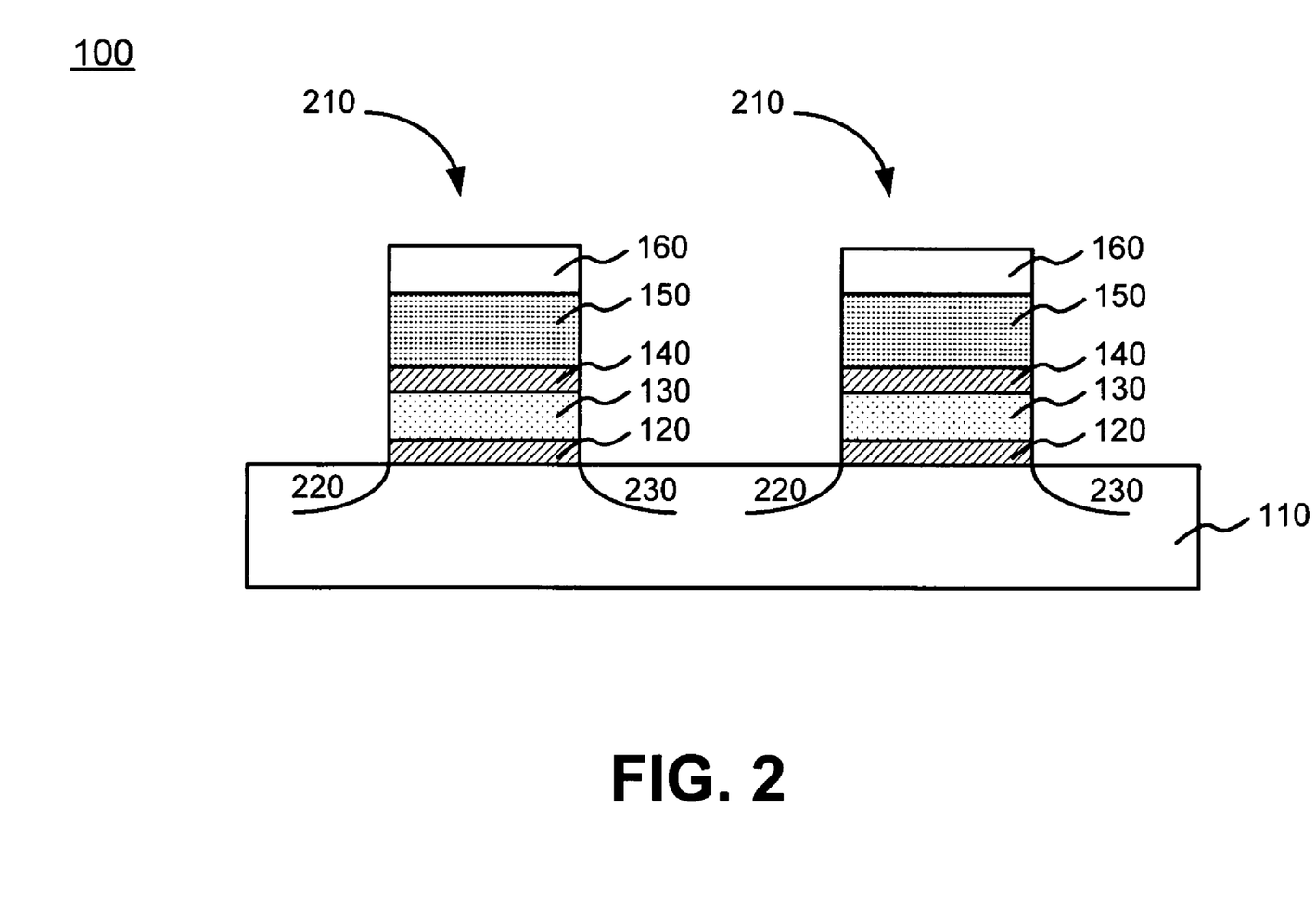
FIG. 2 is a cross-section illustrating the formation of memory cells in accordance with an embodiment of the invention.

Semiconductor device 100 may then be etched, as illustrated in FIG. 2. Referring to FIG. 2, layers 120-150 may be etched in a conventional manner with the etching terminating at substrate 110, thereby forming structures 210. In alternative implementations, the etching may terminate at another layer, such as layer 140. Each structure 210 (also referred to herein as a memory cell 210) may represent a memory cell of semiconductor device 100, where each memory cell 210 includes a dielectric layer 120, a charge storage layer 130, an inter-gate dielectric layer 140 and a control gate 150. Only two memory cells 210 are illustrated in semiconductor device 100 in FIG. 2 for simplicity. It should be understood that semiconductor device 100 may typically include a memory array including a large number of memory cells 210.

In an exemplary implementation consistent with the invention, each memory cell 210 may be a SONOS-type memory cell, with a silicon control gate electrode 150 formed on an oxide-nitride-oxide (ONO) stack (i.e., layers 140, 130 and 120), with nitride layer 130 acting as a charge storage layer, and the ONO stack being formed on a silicon substrate 110.

Source and drain regions 220 and 230 may then be formed in substrate 110, as illustrated in FIG. 2. For example, n-type or p-type impurities may be implanted in substrate 110 to form source and drain regions 220 and 230, based on the particular end device requirements. The particular implantation dosages and energy used to form source and drain regions 220 and 230 may be selected based on the particular end device requirements. One of ordinary skill in the art would be able to optimize the source/drain implantation process based on the particular circuit requirements. It should also be understood that source region 220 and drain region 230 may alternatively be formed at other points in the fabrication process of semiconductor device 100. For example, sidewall spacers may be formed prior to the source/drain ion implantation to control the location of the source/drain junctions based on the particular circuit requirements.

Figure 3:
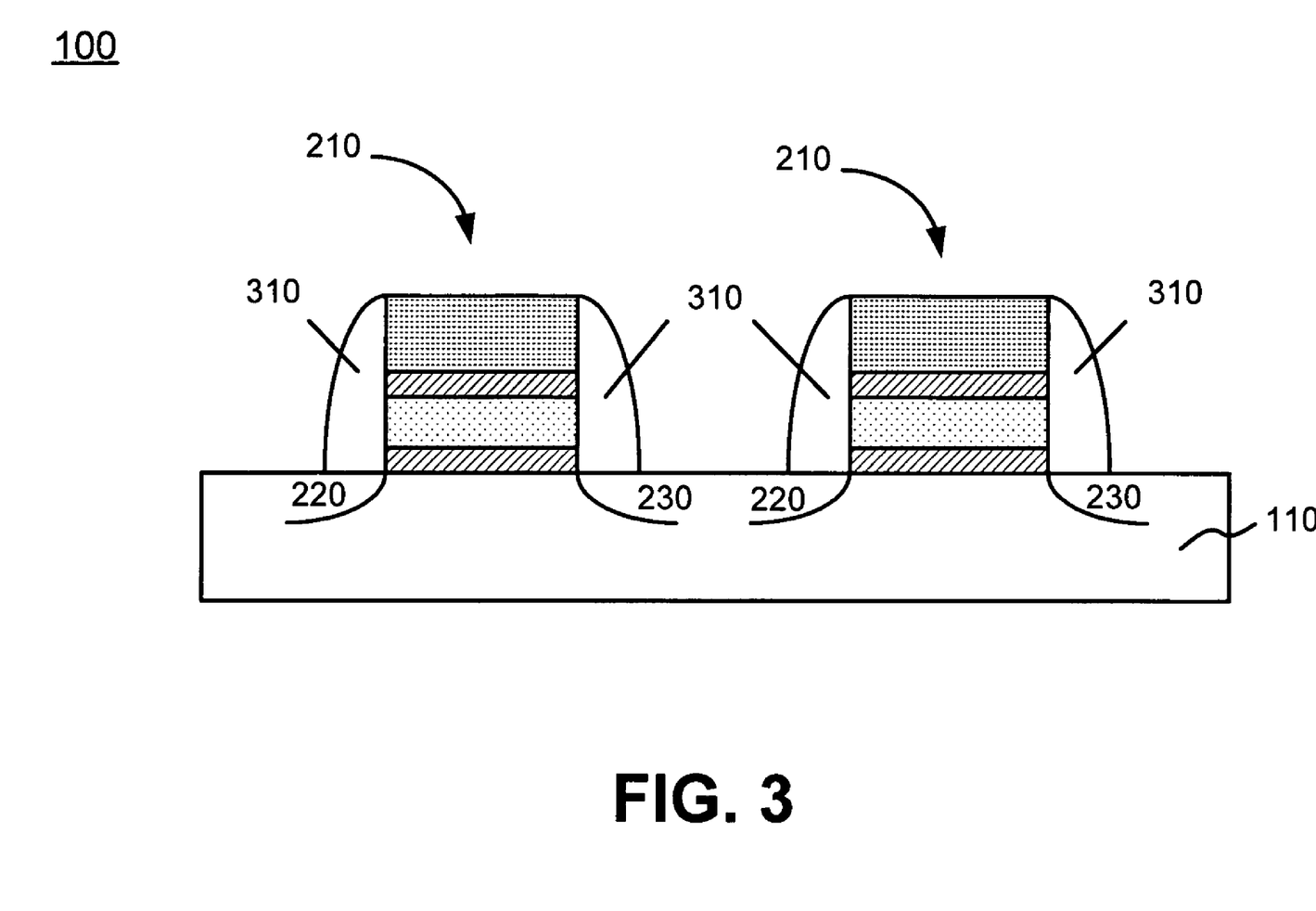
FIG. 3 is a cross-section illustrating the formation of spacers on the device of FIG. 2 in accordance with an embodiment of the invention.

Photoresist masks 160 may be removed using a conventional process. Spacers 310 may be formed adjacent the sidewalls of the memory cells 210, as illustrated in FIG. 3. For example, a dielectric material, such as a silicon oxide, a silicon nitride, a silicon oxynitride or another dielectric material, may be deposited and etched to form spacers 310 on each side of memory cells 210, as illustrated in FIG. 3. Spacers 310 may be used to electrically isolate adjacent memory cells 210 from each other. Spacers 310 may also be used to facilitate the deposition of impurities in semiconductor device 100.

Figure 4A:
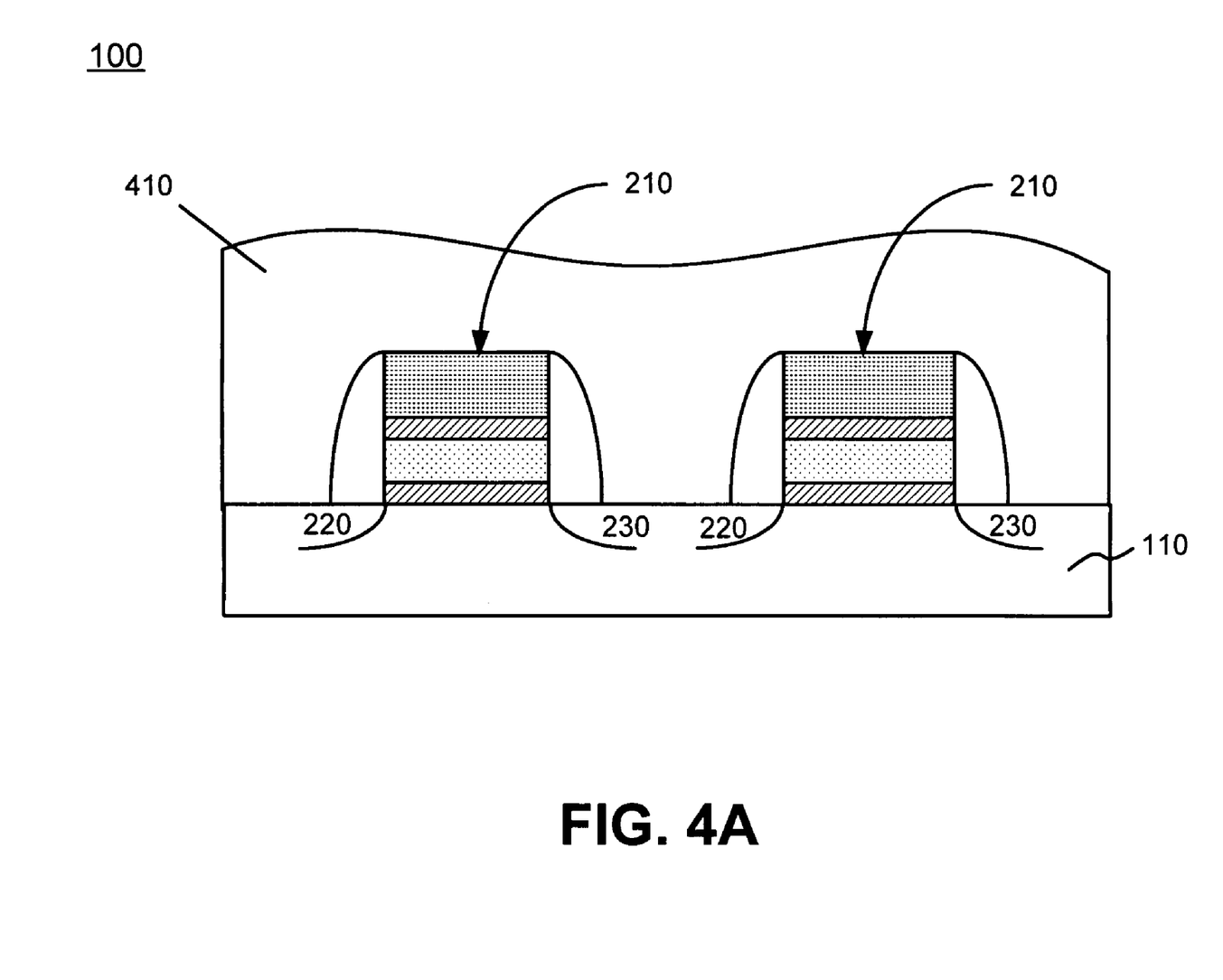
FIG. 4A is a cross-section illustrating the formation of an interlayer dielectric on the device of FIG. 3 in accordance with an embodiment of the invention.

An interlayer dielectric (ILD) 410 may be formed over memory cells 210 and substrate 110, as illustrated in FIG. 4A. In an exemplary implementation, ILD layer 410 may include an oxide (e.g., $SiO_2$), phosphosilicate glass (PSG) material, a boro-phosphosilicate glass (BPSG) material or some other dielectric material. The thickness of ILD 410 may range from about 6,000 Å to about 9,000 Å.

Figure 4B:
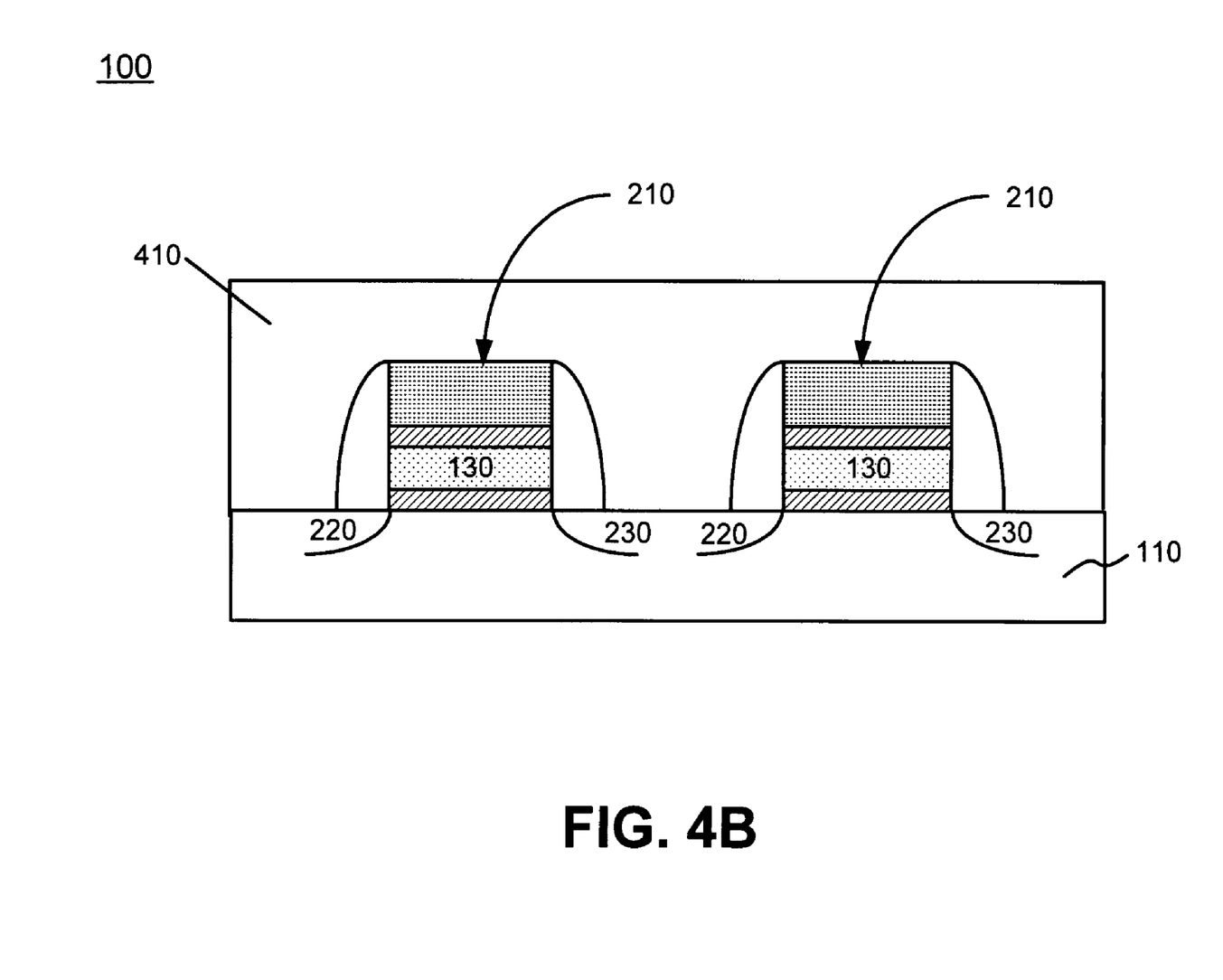
FIG. 4B is a cross-section illustrating the planarization of the interlayer dielectric of FIG. 4A in accordance with an embodiment of the invention.

ILD 410 may optionally be planarized using a conventional process, such as a chemical-mechanical polishing (CMP) process, as illustrated in FIG. 4B. Referring to FIG. 4B, the CMP process may planarize the top surface of ILD 410 to facilitate formation of subsequent structures, such as interconnect lines. ILD 410, consistent with the invention, may represent an ILD located closest to substrate 110. In alternative implementations, ILD 410 may represent an interlayer dielectric formed a number of layers above the surface of substrate 110. In each case, ILD 410 functions to isolate various conductive structures, such as various interconnect lines described below or to isolate source region 220 or drain region 230 from other conductive structures.

Figure 5A:
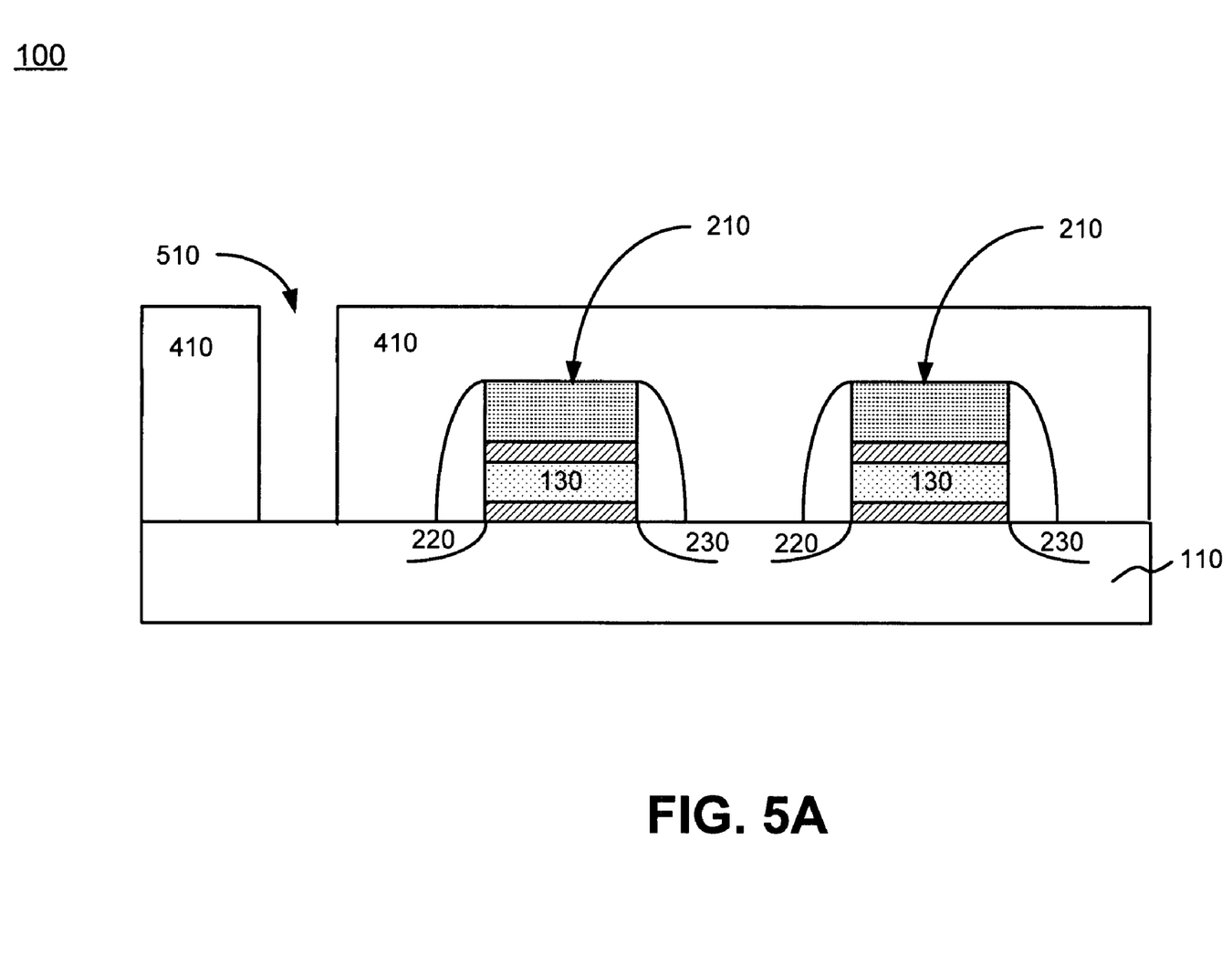
FIGS. 5A and 5B are cross-sections illustrating the formation of a contact in the interlayer dielectric of FIG. 4B in accordance with an embodiment of the invention.
Figure 5B:
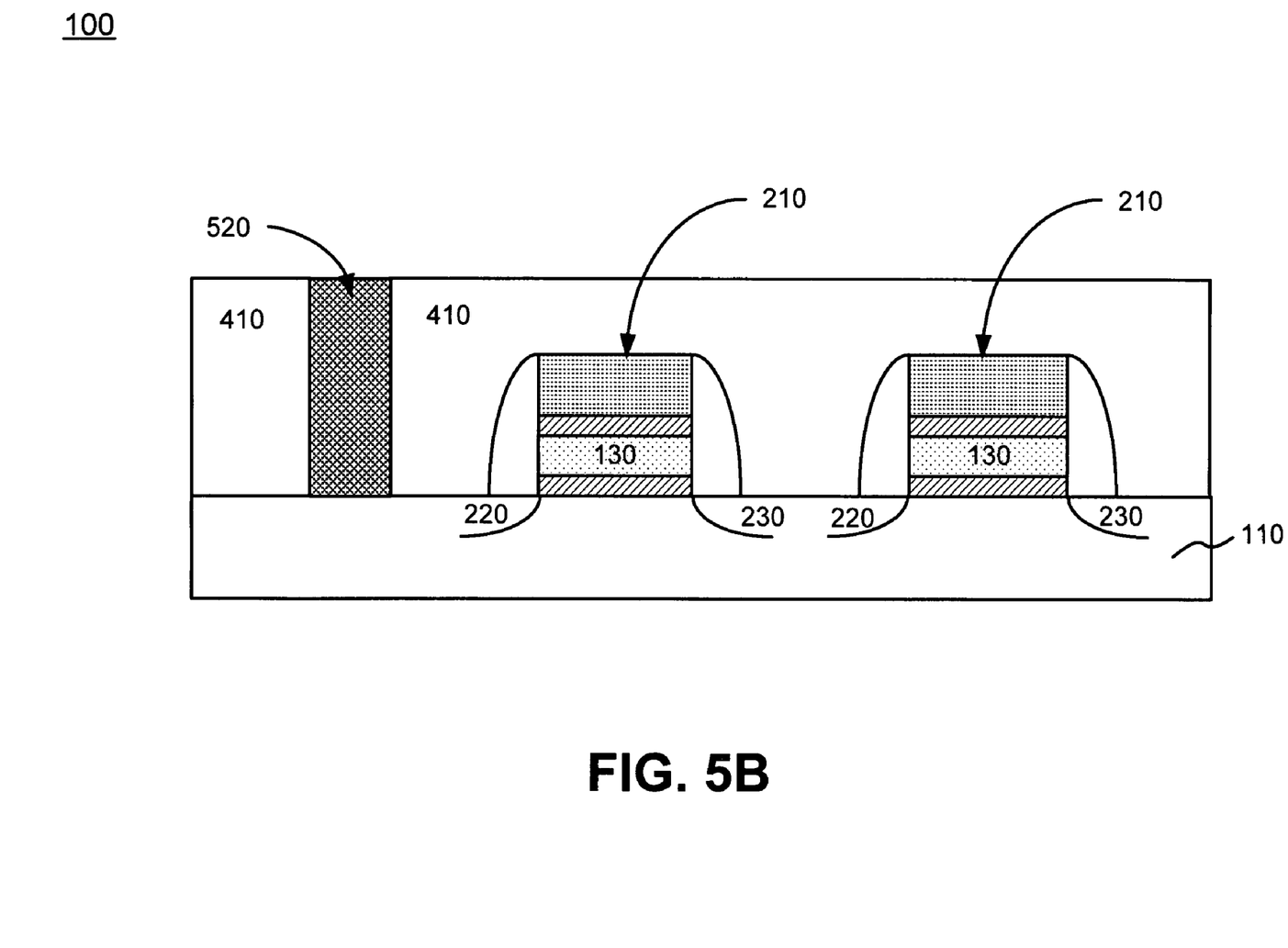

A contact hole/trench 510 may be formed in ILD 410 using conventional photolithographic and etching techniques, as illustrated in FIG. 5A. Contact hole 510 may be used to form a contact to source region 220 or drain region 230. Next, a metal layer 520, such as tungsten, copper or aluminum, may be deposited to fill contact hole 510, as illustrated in FIG. 5B. Metal layer 520 may represent a contact to, for example, source region 220.

Figure 6:
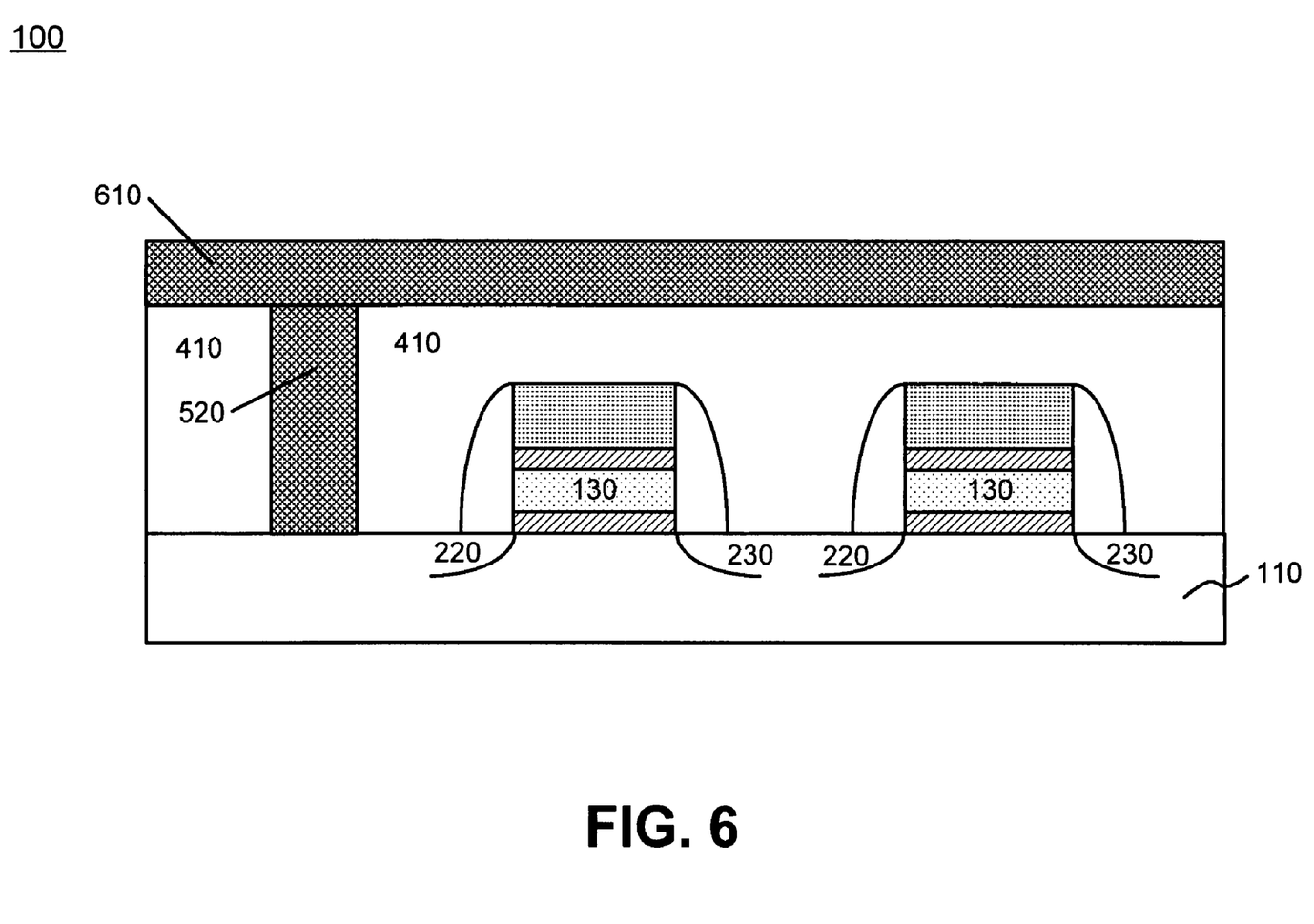
FIG. 6 is a cross-section illustrating the formation of a conductive interconnect on the device of FIG. 5B in accordance with an embodiment of the invention.

A conductive interconnect line 610 may then be formed over the planarized top surface of ILD 410, as illustrated in FIG. 6. For example, a metal, such as copper, aluminum or tungsten, may be deposited to form conductive line 610 that connects various features in semiconductor device 100, such as source or drain regions 220/230 through contact 520 to an external electrode (not shown). Alternatively, conductive line 610 may connect various memory cells 210 in semiconductor device 100. Conductive line 610 may facilitate programming or erasing various memory cells 210 in semiconductor device 100.

Figure 7:
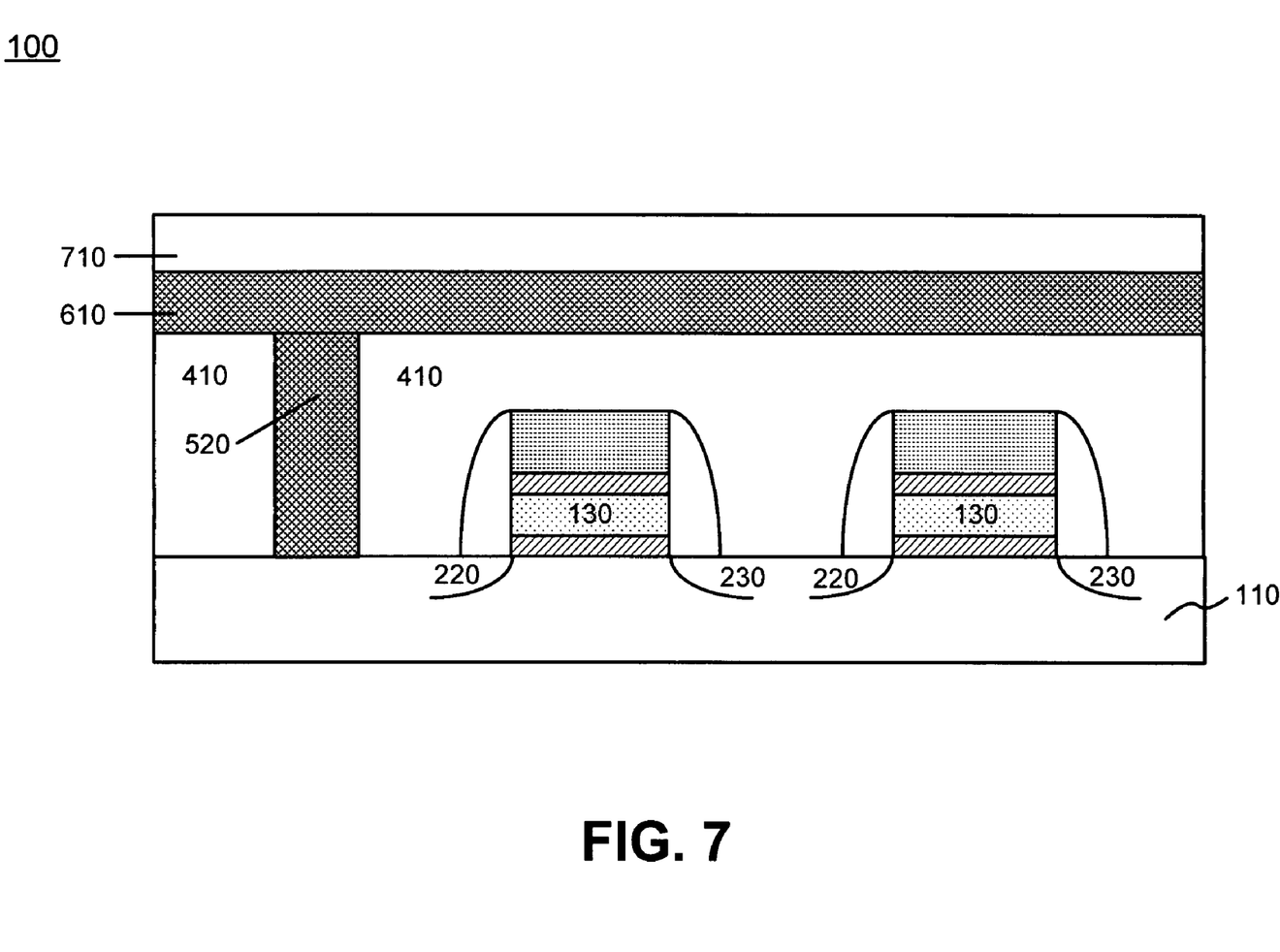
FIG. 7 is a cross-section illustrating the formation of an interlayer dielectric on the device of FIG. 6 in accordance with an embodiment of the invention.

An ILD 710 may be formed over conductive line 610, as illustrated in FIG. 7. In an exemplary implementation, ILD 710 may include an oxide, a PSG material, a BPSG material, an oxide or some other dielectric material. The thickness of ILD 710 may range from about 2,500 Å to about 4,000 Å.

Figure 8:
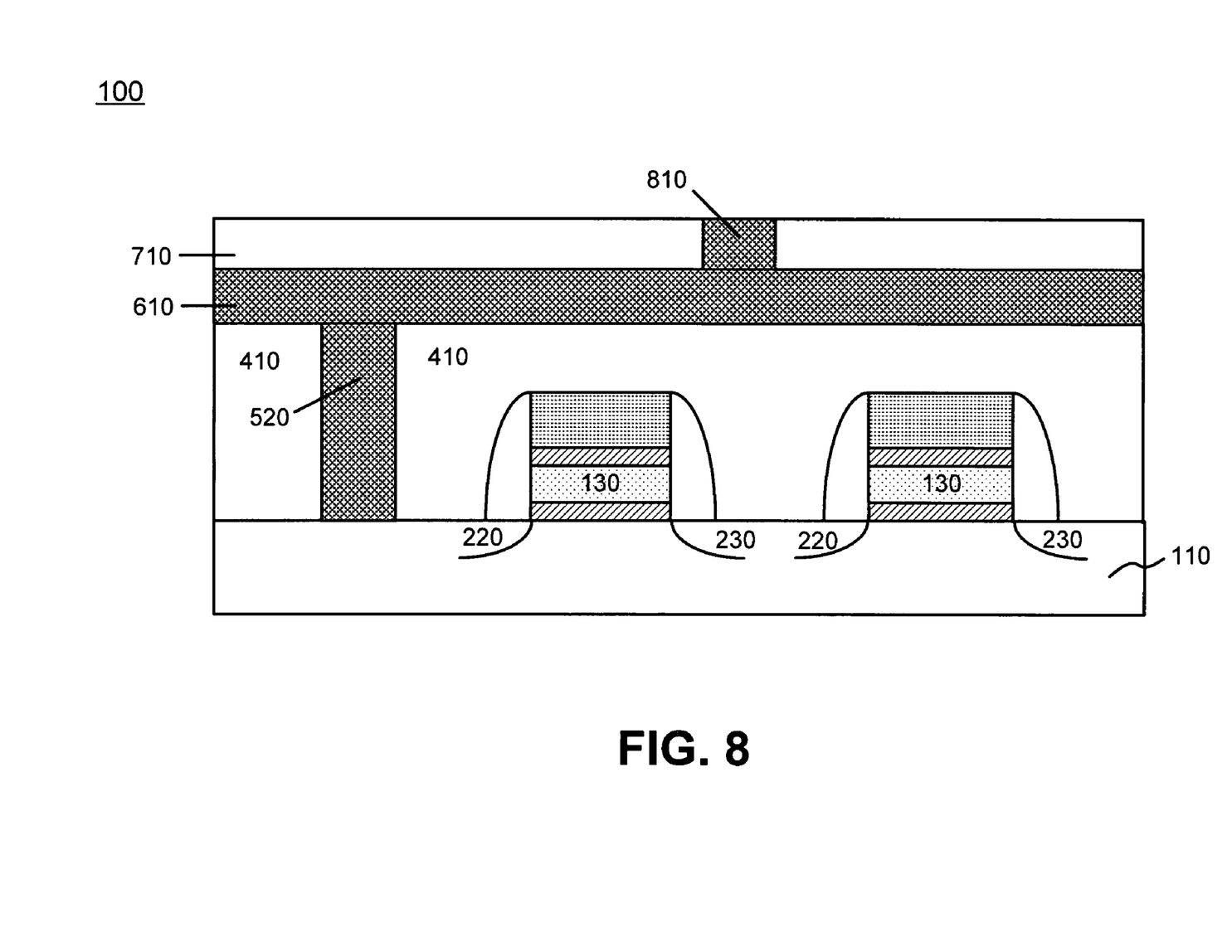
FIG. 8 is a cross-section illustrating the formation of a contact in the interlayer dielectric of FIG. 7 in accordance with an embodiment of the invention.

Various back end of line (BEOL) processing may be performed to complete the fabrication of semiconductor device 100. For example, a contact hole/trench may be formed in ILD 710 followed by deposition of a metal layer 810, such as copper, aluminum or tungsten, as illustrated in FIG. 8. Metal layer 810 may represent a contact to an uppermost. conductive layer of semiconductor device 100. Alternatively, metal layer 810 may represent a contact to any one of a number of conductive layers in semiconductor device 100.

Figure 9:
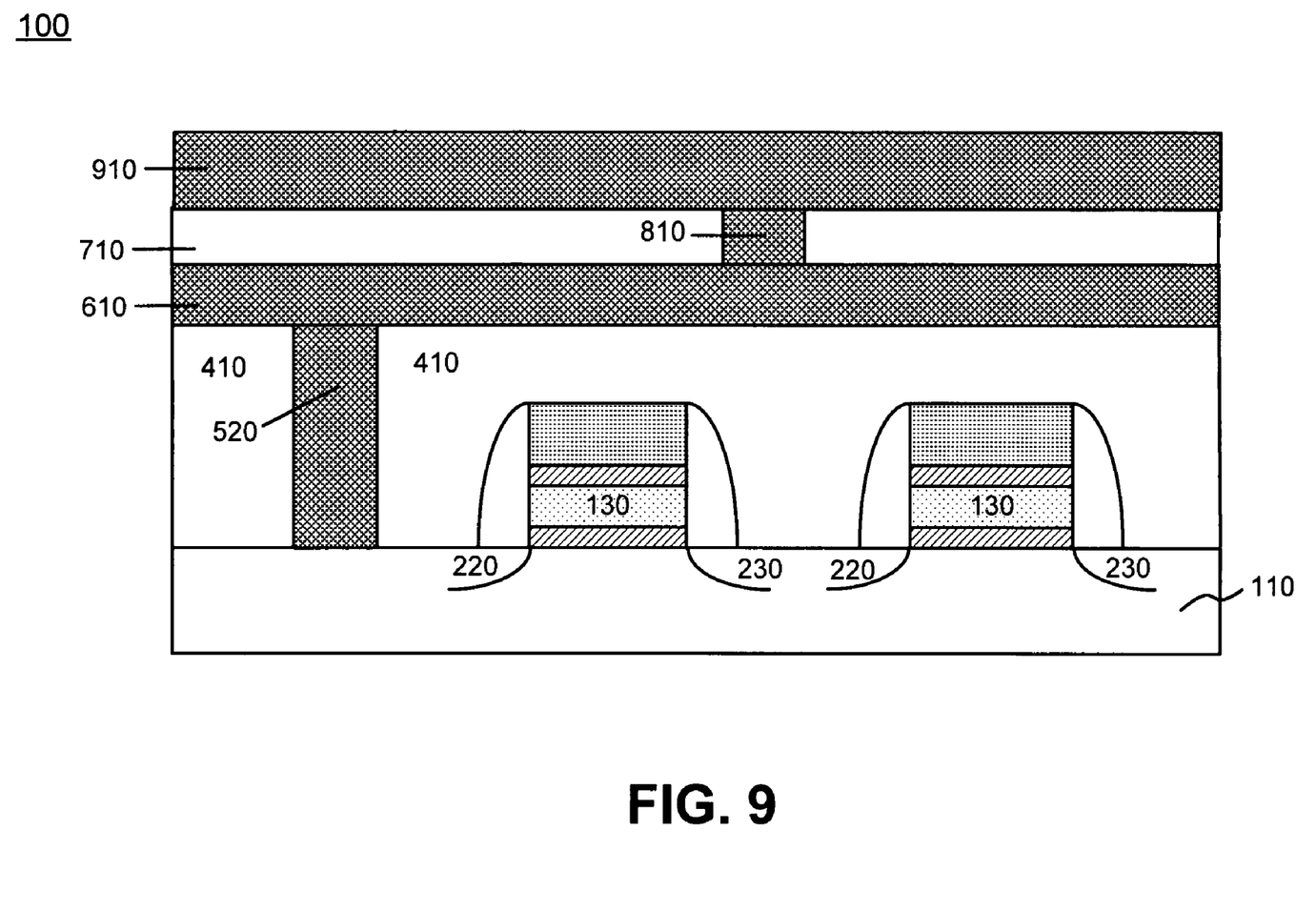
FIG. 9 is a cross-section illustrating the formation of a conductive layer on the device of FIG. 8 in accordance with an embodiment of the invention.

A conductive layer may then be formed over ILD 800. For example, a metal, such as copper, aluminum or tungsten, may be deposited to form conductive line 910, as illustrated in FIG. 9. Conductive line 910 may represent a BEOL structure or connector that connects various features in semiconductor device 100, such as source or drain regions 220/230 to an external electrode (not shown), to facilitate programming or erasing of various memory cells 210 in semiconductor device 100.

Figure 10:
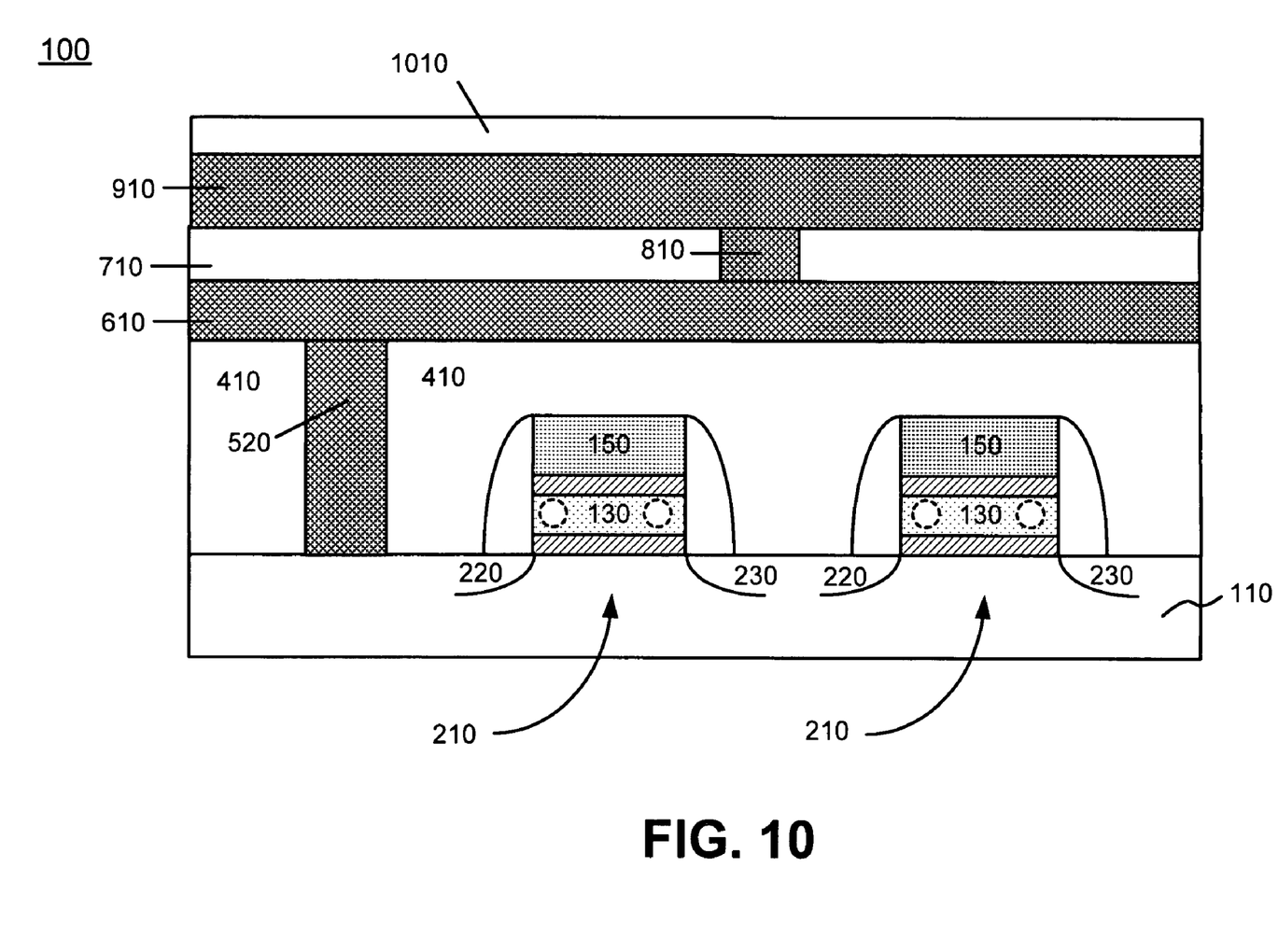
FIG. 10 is a cross-section illustrating the formation of a dielectric layer on the device of FIG. 9 in accordance with an embodiment of the invention.

A top dielectric layer 1010, also referred to as cap layer 1010, may be formed over conductive line 910. Cap layer 1010 may act as a protective layer to prevent damage to conductive line 910 and other portions of semiconductor device 100 during subsequent processing. For example, cap layer 1010 may protect semiconductor device 100 against impurity contamination during subsequent cleaning processes that may be used to complete a working memory device.

While only two ILDs (i.e., ILDs 410 and 710) and two conductive layers (i.e., layers 610 and 910) are illustrated in FIG. 10 for simplicity, it should be understood that semiconductor device 100 may include more ILD layers and conductive layers based on the particular circuit requirements.

As described above, in an exemplary embodiment, semiconductor device 100 illustrated in FIG. 10 may be a SONOS type memory device, with nitride layer 130 acting as a charge storage element for each memory cell 210. Each memory cell 210 may be an EEPROM type memory device and one or more programming circuits (not shown) may be used to facilitate programming and erasing of one or more memory cells 210 of semiconductor device 100, as described in more detail below. Once programmed, electrons remain trapped in nitride layer 130 until an erase procedure is performed.

In an exemplary implementation consistent with the invention, each of memory cells 210 illustrated in FIG. 10 may be configured to store two or more bits of data. For example, charge storage layer 130 may be programmed to store charges representing two separate bits of data by localizing the first and second charges to the respective left and right sides of charge storage layer 130, as illustrated by the dashed ovals in FIG. 10. Each of the two bits of memory cell 210 may be programmed independently by, for example, channel hot electron injection, to store a charge representing a bit on each respective side of the charge storage layer 130. In this manner, the charges in charge storage layer 130 become effectively trapped on each respective side of charge storage layer 130. Erasing of each bit in memory cell 210 may also be performed independently. During erasing, the charges stored in charge storage layer 130 may tunnel through dielectric layer 120 into the source region 220 and drain region 230, respectively. In alternative implementations, the charge storage layer 130 for each of the memory cells 210 may be configured to store charges representing three or more bits of data by localizing the charges in charge storage layer 130.

In this manner, the density of the array of memory cells 210 in semiconductor device 100 may be increased as compared to conventional memory devices that store only one bit of data per cell. In alternative implementations, each memory cell 210 may be configured to store one bit of data per memory cell 210. In addition, in alternative implementations, semiconductor device 100 may be a floating gate memory device in which layer 130 is formed from a conductive material, such as polycrystalline silicon, and functions as a charge storage element for each memory cell 210.

Figure 11:
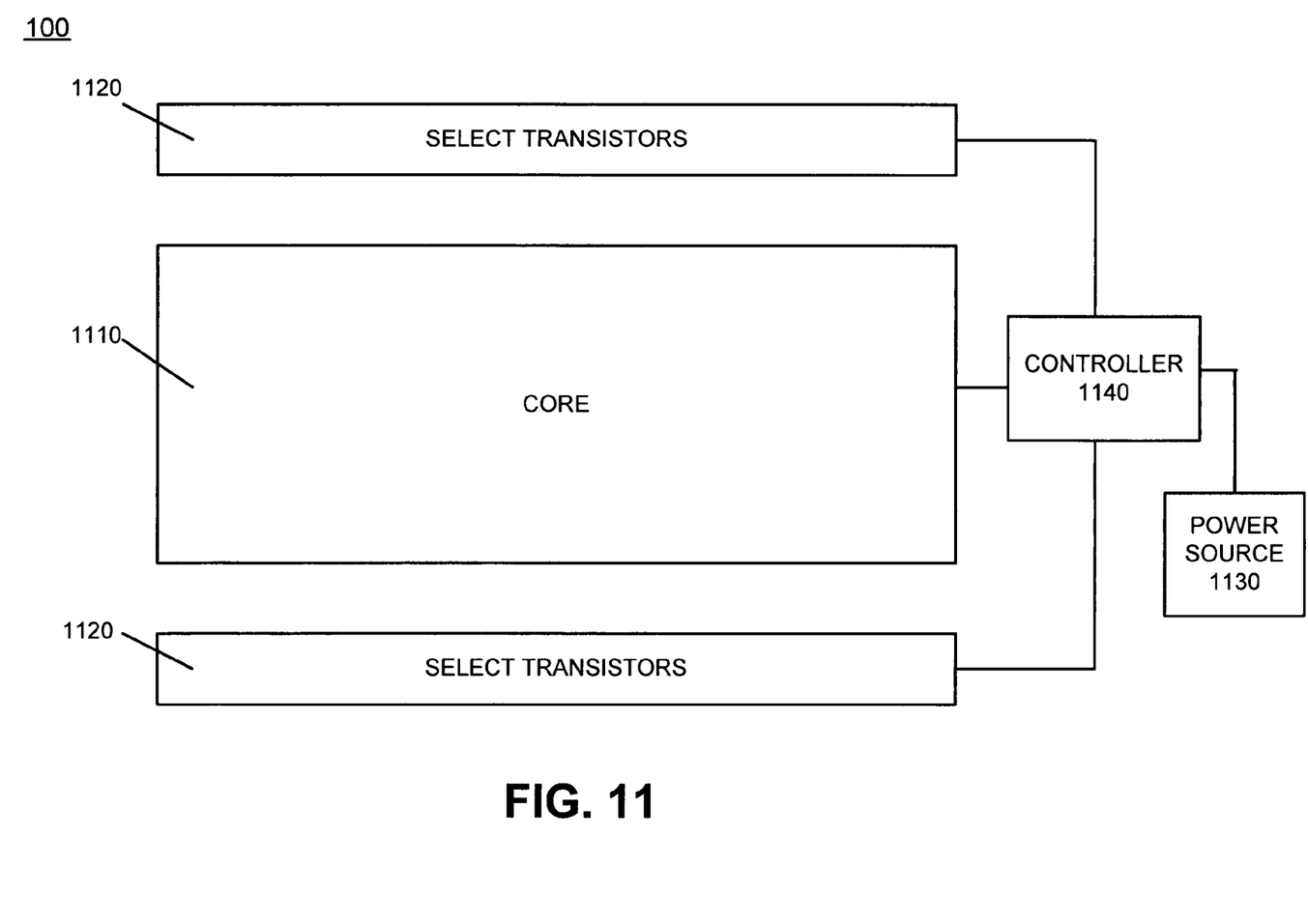
FIG. 11 is a block diagram of a semiconductor device in accordance with an embodiment of the invention.

As described above, semiconductor device 100 may include a large array of memory cells. For example, referring to FIG. 11, semiconductor device 100 may include a core area 1110 that includes an array of memory cells 210 (not shown), select transistor areas 1120 located on either end of core area 1110, power source 1130 and controller 1140. Select transistor areas 1120 include transistors (not shown) that may be used to select one or more of memory cells 210 for programming, reading or erasing. Power source 1130 may supply the appropriate voltages to controller 1140 and controller 1140 may apply the appropriate voltages to the select transistors and memory cells 210 to facilitate programming and erasing one or more of memory cells 210. Semiconductor device 100 may also include a word line decoder and bit line decoder (not shown) that facilitate addressing particular memory cells 210 for programming, reading or erasing. The devices illustrated in FIG. 11, such as controller 1140, core area 1110 and select transistor areas 1120, may be located on a single integrated circuit. Power source 1130 may also be located on same integrated circuit. Alternatively, the devices illustrated in FIG. 11 may be distributed over more than one integrated circuit.

Semiconductor device 100, consistent with the invention, may be an EEPROM device in which a sector of memory cells 210 or a portion of a sector (e.g., one or more input/output (I/O) lines that are each associated with a large number of bit lines) that includes a large number of memory cells 210 may be programmed and/or erased together. Memory cells are conventionally programmed by applying a voltage of about 9-10 volts to the control gate, applying a voltage of about 5 volts to the drain and grounding the substrate and the source. In an exemplary embodiment of the invention, memory cells 210 may be programmed by applying a voltage to control gate 150 and drain region 230, while also applying a positive bias to source region 220 and/or applying a negative bias to substrate 110, as described in more detail below.

Figure 12:
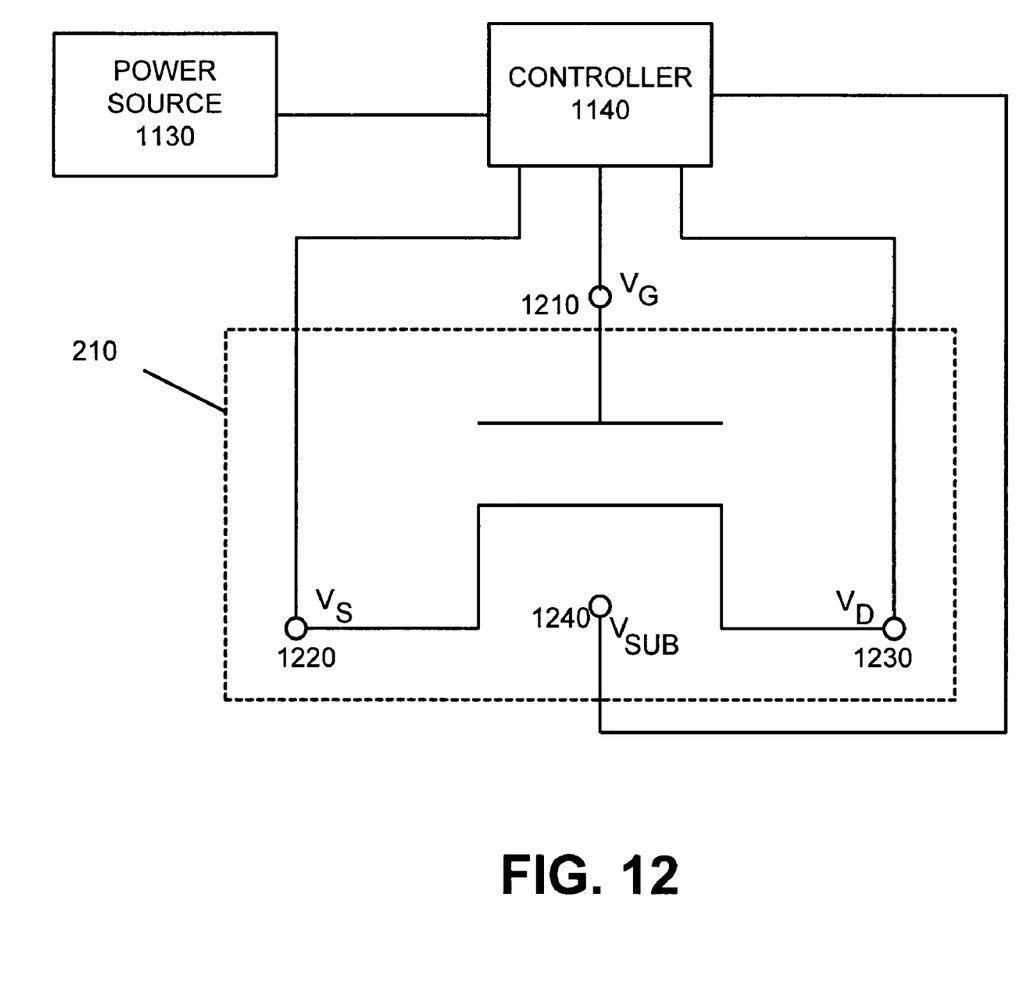
FIG. 12 is a schematic diagram illustrating a programming procedure in accordance with an embodiment of the invention.

FIG. 12 is a schematic diagram illustrating a programming procedure associated with one of memory cells 210 located in core area 1110 consistent with the invention. Referring to FIG. 12, memory cell 210 may include a control gate terminal 1210, source terminal 1220, drain terminal 1230 and substrate terminal 1240 connected to the control gate 150, source region 220, drain region 230 and substrate 110, respectively. In an exemplary implementation consistent with the invention, memory cell 210 may be programming by applying a voltage ranging from about 9-10 to control gate terminal 1210, applying a voltage ranging from about 3 volts to about 5 volts to drain terminal 1230 and applying a positive bias to source terminal 1220.

For example, in one implementation, a voltage of about 9.5 volts may be applied to control gate terminal 1210 and a voltage of about 4.0 volts may be applied to drain terminal 1230. In addition, concurrently with the application of the voltages to control gate terminal 1210 and drain terminal 1230, a voltage ranging from about 0.2 volts to about 1.5 volts maybe applied to source terminal 1220. For example, in one implementation, a voltage of about 0.8 volts may be applied to source terminal 1220. In this implementation, substrate terminal 1240 may be grounded during the programming of memory cell 210. Controller 1140 may apply the voltages to control gate terminal 1210, source terminal 1220 and drain terminal 1230 for a duration ranging from about 0.1 microseconds (µs) to about 5 µs.

It has been found that applying a positive bias voltage to source terminal 1220 in the range described above concurrently with the application of voltages to control gate terminal 1210 and drain terminal 1230 lowers the programming current needed to program memory cell 210. For example, applying the positive bias to source terminal 1220 may reduce the programming current needed to program memory cell 210 from about 200 microamps (µA) to about 140 µA or reduce the programming current by about 30 percent. Advantageously, this reduction in programming current enables a large array of memory cells 210 to be programmed in an efficient manner without increasing programming power levels.

In another implementation consistent with the invention, a negative bias may applied to substrate terminal 1240 concurrently with the application of voltages to control gate terminal 1210 and drain terminal 1230. For example, in one implementation, a voltage in the range described above may applied to control gate terminal 1210 (e.g., about 9.5 volts) and a voltage in the range described above may be applied to drain terminal 1230 (e.g., about 4.0 volts). In addition, concurrently with the application of the voltages to control gate terminal 1210 and drain terminal 1230, a voltage ranging from about –0.2 volts to about –1.5 volts may be applied to substrate terminal 1240. For example, in one implementation, a voltage of about –0.8 volts may be applied to substrate terminal 1240. In this implementation, source terminal 1220 may be grounded during the programming of memory cell 210. Controller 1140 may apply the voltages to control gate terminal 1210, source terminal 1220 and substrate terminal 1240 for a duration ranging from about 0.1 µs to about 5 µs.

It has also been found that applying a negative bias voltage to substrate terminal 1240 concurrently with the application of voltages to control gate terminal 1210 and drain terminal 1230 lowers the programming current needed to program memory cell 210. For example, applying a negative bias to substrate terminal 1220 may reduce the programming current needed to program memory cell 210 from about 200 µA to about 140 µA or reduce the programming current by about 30 percent. Advantageously, this reduction in programming current enables a large array of memory cells 210 to be programmed in an efficient manner without increasing programming power levels.

In still another implementation, both a positive bias voltage in the range described above may be applied to source terminal 1220 and a negative bias in the range described above may be applied to substrate terminal 1240 concurrently with the application of the voltages to control gate terminal 1210 and drain terminal 1230. For example, in one implementation, a bias voltage of about 0.8 volts may be applied to source terminal 1220 and a bias voltage of about –0.5 volts may be applied to substrate terminal 1240 concurrently with the application of the voltages to control gate terminal 1210 and drain terminal 1230. In this implementation, providing the same programming voltages to control gate terminal 1210 and drain terminal 1230 results in faster programming speed, as compared to conventional programming techniques. For example, in this implementation, applying the positive bias to source terminal 1220 and the negative bias to substrate terminal 1240 may reduce the time needed to program memory cells 210 from about 1.0 µs to about 0.2 µs, or increase the programming speed by about 500 percent.

In summary, during a programming procedure, controller 1140 may identify the particular memory cells 210 upon which a programming or write procedure is to be performed. For example, controller 1140 may identify the appropriate word line(s) and bit line(s) and apply the appropriate voltages via power source 1130 to control gate terminal 1210, drain terminal 1230 and one of or both of source terminal 1220 and substrate terminal 1240. Providing the voltages described above to source terminal 1220 and/or substrate terminal 1240 during a programming procedure enables memory cells 210 to be programmed in an efficient manner without increasing power levels and also may enable memory cells 210 to be programmed more quickly. Advantageously, this helps improve overall operation and increases reliability for memory device 100.

In the previous descriptions, numerous specific details are set forth, such as specific materials, structures, chemicals, processes, etc., in order to provide a thorough understanding of the invention. However, implementations consistent with principles of the invention can be practiced without resorting to the details specifically set forth herein. In other instances, well known processing structures have not been described in detail, in order not to unnecessarily obscure the thrust of the invention.

For example, the dielectric and conductive layers used in manufacturing a semiconductor device in accordance with the invention can be deposited by conventional deposition techniques. For example, various types of chemical vapor deposition (CVD) processes, including low pressure chemical vapor deposition (LPCVD) and enhanced chemical vapor deposition (ECVD) can be employed. In addition, conventional electroplating, photolithographic and etching techniques may also be employed, and hence, the details of such techniques have not been set forth herein in detail.

Implementations of the invention are applicable in the manufacturing of semiconductor devices and particularly in memory devices having small design features and high circuit density. The invention is applicable to the formation of any of various types of semiconductor devices, and hence, details have not been set forth in order to avoid obscuring the thrust of the invention.

In addition, no element, act or process used in the description of the invention should be construed as critical or essential to the invention unless explicitly described as such. Also, as used herein, the article "a" is intended to include one or more items. Where only one item is intended, the term "one" or similar language is used.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. In a non-volatile memory device comprising a plurality of memory cells, each of the plurality of memory cells comprising a source, a drain, a dielectric layer formed on a substrate, a charge storage element comprising silicon nitride formed on the dielectric layer, an inter-gate dielectric formed on the charge storage element, and a control gate formed on the inter-gate dielectric, a method of programming at least one of the memory cells, comprising:
   applying a first voltage to the control gate;
   applying a second voltage to the drain the second voltage ranging from about 3 volts to about 5 volts; and
   applying at least one of a positive bias to the source or a negative bias to the substrate,
   wherein the charge storage element in each of the plurality of memory cells is configured to store charges representing two bits of information and applying the first and second voltages and at least one of the positive bias or the negative bias comprises:
   applying the first and second voltages and at least one of the positive bias or the negative bias for a duration ranging from about 0.1 microseconds (μs) to about 5 μs.

2. The method of claim 1, wherein the first voltage ranges from about 9 volts to about 10 volts, and applying at least one of a positive bias to the source or a negative bias to the substrate comprises:
   applying a positive bias to the source ranging from about 0.2 volts to about 1.5 volts.

3. The method of claim 2, wherein the positive bias is about 0.8 volts.

4. The method of claim 3, further comprising:
   grounding the substrate.

5. The method of claim 1, wherein the applying at least one of a positive bias to the source or a negative bias to the substrate comprises:
   applying a negative bias to the substrate ranging from about −0.2 volts to about −1.5 volts.

6. The method of claim 5, wherein the negative bias is about −0.8 volts.

7. The method of claim 1, wherein the applying at least one of a positive bias to the source or a negative bias to the substrate comprises:
   applying a positive bias to the source and a negative bias to the substrate.

8. The method of claim 1, wherein the applying at least one of a positive bias to the source or a negative bias to the substrate reduces programming current associated with programming the at least one memory cell relative to programming the at least one memory cell without applying at least one of the positive bias or negative bias.

9. A method for programming memory cells in a non-volatile memory device, each of the memory cells including a dielectric charge storage element, the method comprising:
   selecting a first group of memory cells to be programmed;
   applying a first voltage to a word line associated with the first group of memory cells for a duration ranging from about 0.1 microseconds (μs) to about 5 μs;
   applying a second voltage to a drain line associated with the first group of memory cells for a duration ranging from about 0.1 μs to about 5 μs; and
   applying at least one of a positive voltage to a source line associated with the first group of memory cells or a negative voltage to a substrate region associated with the first group of memory cells for a duration ranging from about 0.1 μs to about 5 μs.

10. The method of claim 9, wherein the applying at least one of a positive voltage to a source line or a negative voltage to a substrate region comprises:
    applying a positive voltage to the source line ranging from about 0.2 volts to about 1.5 volts.

11. The method of claim 9, wherein the applying at least one of a positive voltage to a source line or a negative voltage to a substrate region comprises:
    applying a negative voltage to the substrate region ranging from about −0.2 volts to about −1.5 volts.

12. The method of claim 9, wherein the applying at least one of a positive voltage to a source line or a negative voltage to a substrate region comprises:
    applying a positive voltage to the source line and a negative voltage to the substrate region.

13. The method of claim 12, wherein the positive voltage ranges from about 0.2 volts to about 1.5 volts and the negative voltage ranges from about −0.2 volts to about −1.5 volts.

14. The method of claim 9, wherein the dielectric charge store element in each of the memory cells in the non-volatile memory device comprises silicon nitride configured to store charges representing two or more bits of information.

15. An integrated circuit, comprising:
    a plurality of memory cells, each of the plurality of memory cells comprising a dielectric charge storage element; and
    a controller configured to program a first one of the plurality of memory cells, wherein when programming the first memory cell, the controller is configured to:
    apply a first voltage to a control gate associated with the first memory cell for a duration ranging from about 0.1 microseconds (μs) to about 5 μs,
    apply a second voltage to a drain region associated with the first memory cell for a duration ranging from about 0.1 μs to about 5 μs,
    apply a third voltage to a source region associated with the first memory cell for a duration ranging from about 0.1 μs to about 5 μs, and
    apply a fourth voltage to a substrate region associated with the first memory cell for a duration ranging from about 0.1 μs to about 5 μs.

16. The integrated circuit of claim 15, wherein the third voltage ranges from about 0.2 volts to about 1.5 volts.

17. The integrated circuit of claim 16, wherein the fourth voltage ranges from about −0.2 volts to about −1.5 volts.

18. The integrated circuit of claim 16, wherein the first voltage ranges from about 9 volts to about 10 volts and the second voltage ranges from about 3 volts to about 5 volts.

19. The integrated circuit of claim 15, wherein the charge storage element in each of the plurality of memory cells comprises silicon nitride configured to store charges representing at least two bits of information.

* * * * *